(12) United States Patent
Skorupski et al.

(10) Patent No.: US 6,629,348 B2
(45) Date of Patent: Oct. 7, 2003

(54) SUBSTRATE ADHESION ENHANCEMENT TO FILM

(75) Inventors: Edward C. Skorupski, Stillwater, NY (US); Jeffrey T. Gray, Cambridge, NY (US); John A. Andresakis, Clifton Park, NY (US); Wendy Herrick, Clifton Park, NY (US)

(73) Assignee: Oak-Mitsui, Inc., Hoosick Falls, NY (US)

( * ) Notice: Subject to any disclaimer, the term of this patent is extended or adjusted under 35 U.S.C. 154(b) by 84 days.

(21) Appl. No.: 09/846,705

(22) Filed: May 1, 2001

(65) Prior Publication Data

US 2002/0162218 A1 Nov. 7, 2002

(51) Int. Cl.$^7$ ................................................. D02J 1/22
(52) U.S. Cl. ............................. 29/246; 29/825; 29/847; 427/96
(58) Field of Search .......................... 29/246, 825, 847; 427/96

(56) References Cited

U.S. PATENT DOCUMENTS

| | | | |
|---|---|---|---|
| 4,382,101 A | 5/1983 | Polak | 427/40 |
| 4,615,763 A | 10/1986 | Gelorme et al. | 156/643 |
| 4,634,631 A | 1/1987 | Gazit et al. | 428/421 |
| 4,639,285 A | 1/1987 | Suzuki et al. | 156/272.6 |
| 4,755,424 A | 7/1988 | Takeoka et al. | 428/323 |
| 4,765,860 A | 8/1988 | Ueno et al. | 146/272.6 |
| 4,806,432 A | 2/1989 | Eguchi et al. | 428/458 |
| 4,863,808 A | 9/1989 | Sallo | 428/601 |
| 4,915,983 A * | 4/1990 | Lake et al. | 156/150 |
| 4,923,718 A | 5/1990 | Iida et al. | 427/386 |
| 5,089,346 A | 2/1992 | Imaizumi et al. | 428/458 |
| 5,325,583 A * | 7/1994 | Shimizu et al. | 156/261 |
| 5,367,764 A * | 11/1994 | DiStefano et al. | 174/260 |
| 5,570,504 A * | 11/1996 | DiStefano et al. | 29/830 |
| 5,570,506 A * | 11/1996 | Tawata et al. | 29/830 |
| 5,679,230 A | 10/1997 | Fatcheric et al. | 205/50 |
| 5,800,650 A * | 9/1998 | Anderson et al. | 156/150 |
| 5,861,192 A | 1/1999 | Nakata et al. | 427/322 |
| 6,171,714 B1 | 1/2001 | Bergkessel et al. | 428/618 |
| 6,177,357 B1 | 1/2001 | Lu | 438/745 |

FOREIGN PATENT DOCUMENTS

EP     0 442 197 A2    10/1990

OTHER PUBLICATIONS

Patent Abstracts of Japan, Pub. No. 04207097, Pub. Date Jul. 29, 1992.
Japanese Abstract JP 4282844, Published Oct. 07, 1992.
Japanese Abstract JP2000289165, Published Oct. 17, 2000.

* cited by examiner

Primary Examiner—Joseph J. Hail, III
Assistant Examiner—Alvin J. Grant
(74) Attorney, Agent, or Firm—Roberts & Mercanti, LLP

(57) ABSTRACT

The invention relates to the manufacture of printed circuit boards having improved interlayer adhesion. More particularly, the present invention pertains to adhesiveless printed circuit boards having excellent thermal performance and useful for producing high-density circuits. A metal foil is laminated to an etched surface of a polyimide substrate having a polyimide film thereon. Etching the substrate surface allows for strong adhesion of a pure polyimide film to the substrate.

32 Claims, No Drawings

SUBSTRATE ADHESION ENHANCEMENT TO FILM

BACKGROUND OF THE INVENTION

1. Field of the Invention

The present invention relates to the manufacture of printed circuit boards having improved interlayer adhesion. More particularly, the present invention pertains to adhesiveless, flexible printed circuit boards having excellent thermal performance and useful for producing high-density circuits.

2. Description of the Related Art

Printed circuit boards are employed in a wide variety of applications. For example, they can be found inside radio and television sets, telephone systems, automobile dashboards and computers. They also play an important role in the operation of airborne avionics and guidance systems. Polyimide films are used in the production of circuit boards because of their excellent flex characteristics and good electrical properties. More particularly, it is common to attach a layer of a conductive metal foil to a surface of a polyimide film to provide a surface upon which a pattern of an electrical conductor can be provided. In such cases, it has been recognized in the art that any movement of the metal foil on the polymeric film could potentially impair the performance of the equipment incorporating the circuit board. To avoid this problem, it is necessary that the conductive metal layer be strongly adhered to the polymeric substrate to prevent any shifting of the metal layer on the film.

There have been various efforts in the art to improve the adhesion of metal foils to polymeric substrates in forming printed circuit boards while maintaining good thermal resistance and low cost of manufacture. U.S. Pat. No. 4,382,101 offers one proposed solution to this problem wherein a substrate is etched with a plasma etchant and then a metal is vapor deposited onto the etched surface of the substrate. This process requiring the vapor deposition of a metal directly onto an etched surface is very expensive. U.S. Pat. No. 4,615,763 provides a method of improving adhesion of a photosensitive material to a substrate by selectively etching resinous portions of a substrate comprising a resinous material and an inorganic particulate material. U.S. Pat. No. 4,639,285 teaches a process wherein a metal foil is attached to a surface of a synthetic resin substrate via an intermediate silicone-based adhesive layer after treating the substrate surface with a low temperature plasma. The low temperature plasma utilized is an organo-silicon compound with an inorganic gas, such as oxygen. U.S. Pat. No. 4,755,424 provides a polyimide film produced from a polyimide containing a dispersed inorganic powder. Particles of the inorganic powder protrude from the film surface to roughen the film. The film surfaces are then treated with a corona discharge treatment to alter the surface chemistry of the film. U.S. Pat. No. 4,863,808 teaches a polyimide film coated with a vapor deposited chromium layer, a vapor deposited copper layer, and followed by electroplating with copper. U.S. Pat. No. 5,861,192 provides a wet chemistry method with mechanical and projection grinding to increase the adhesion of a polyimide film surface.

The present invention provides an improved solution over those of the prior art. A process for forming printed circuit boards is provided wherein a polymeric film is coated onto at least one surface of an etched polymeric substrate followed by laminating a metal foil onto the coated film. The substrate surface may be etched with either a chemical or plasma etchant, and may comprise either the same or a different material than the polymeric film. The result is a circuit board with a substrate that exhibits high thermal resistance and excellent electrical insulating properties.

SUMMARY OF THE INVENTION

The invention provides a process for forming a printed circuit board composite comprising:
   a) etching at least one of two opposite surfaces of a planar polymeric substrate;
   b) attaching a polymeric film onto one or both etched surfaces of the polymeric substrate; and
   c) laminating and attaching a metal foil onto the polymeric film.

The invention further provides a process for forming a printed circuit board comprising:
   a) etching at least one of two opposite surfaces of a planar polymeric substrate;
   b) attaching a polymeric film onto one or both etched surfaces of the polymeric substrate;
   c) laminating and attaching a metal foil onto the polymeric film;
   d) depositing a photoresist onto the metal foil;
   e) exposing and developing the photoresist, thereby revealing underlying portions of the metal foil; and
   f) removing the revealed underlying portions of the metal foil.

It is also within the scope of the invention to form multilayered printed circuit boards or composites by incorporating additional polymeric films or metal foil layers. A description of these embodiments is included herein.

DETAILED DESCRIPTION OF THE PREFERRED EMBODIMENT

The invention provides a printed circuit board support having improved interlayer adhesion, enhanced thermal stability and excellent electrical insulating properties as compared to the prior art.

The first step in the process of the invention is to etch at least one surface of two opposite surfaces of a suitable substrate with an appropriate etchant, thereby forming a first etched surface. Typical substrates are those suitable to be processed into a printed circuit or other microelectronic device. Preferred substrates for the present invention are polymeric substrates and non-exclusively include materials comprising polyester, polyimide, liquid crystal polymers and polymers reinforced with materials such as fiberglass, aramid (Kevlar), aramid paper (Thermount), polybenzoxolate paper or combinations thereof. Of these a polyimide substrate is the most preferred. Also suitable are semiconductor materials such as gallium arsenide (GaAs), silicon and compositions containing silicon such as crystalline silicon, polysilicon, amorphous silicon, epitaxial silicon, and silicon dioxide ($SiO_2$) and mixtures thereof. The preferred thickness of the substrate is of from about 5 $\mu$m to about 200 $\mu$m, more preferably from about 5 $\mu$m to about 50 $\mu$m.

Appropriate etchants are those which are capable of selectively removing portions of the substrate surface. Preferred etchants for the present invention non-exclusively include plasma etchants and concentrated aqueous etching solutions.

Preferred are aqueous alkaline solutions, non-exclusively include Group I or Group II hydroxides which include hydroxides of elements from Groups I or II of the periodic table, such as sodium hydroxide and potassium hydroxide. Ammonium hydroxide may also be used. The useful concentration of an aqueous etchant varies with the chemical composition of the substrate to be etched. Typically useful etchant concentrations range from about 5% to about 25% by weight of the etchant material, preferably from about 10% to about 20%. For example, one useful aqueous etchant is a potassium hydroxide solution having a concentration of from about 8% to about 12% of potassium hydroxide. Also suitable is a sodium hydroxide solution at a concentration of from about 8% to about 16% by weight of sodium hydroxide.

Any plasma etching technique which is suitable for etching polymer substrates may be used. This plasma etchant is a highly charged gas that bombards the film surface with positive and negative charged species causing impurities on the surface to degrade as well as ablating the film surface. These include halogen containing plasma etching materials and oxygen containing plasma etching materials. The preferred plasma etchant comprises a gaseous mixture of oxygen ($O_2$) and tetrafluoromethane ($CF_4$). Preferably the plasma etchant comprises at a mixture of oxygen plasma and tetrafluoromethane plasma comprising least about 3% of tetrafluoromethane, more preferably it comprises from about 3% to about 20% and still more preferably from about 7% to about 20% of tetrafluoromethane with the balance being oxygen. This minimum quantity of tetrafluoromethane is important to prevent any over etching of the substrate.

The etching step of the process of the present invention is accomplished by contacting the polymeric film with the aqueous base etchant or plasma etchant.

Etching is conducted by contacting the areas of the substrate to be etched with the etchant material. Plasma etching is conducted under conditions sufficient to remove at least about 0.45 $\mu$m from at least one surface of the substrate. Such procedures are well known in the art. In another embodiment of the invention, both surfaces of the substrate are etched, allowing additional layers to be added to the printed circuit board support of the invention having superior adhesion to the substrate.

When using an aqueous base etchant, the duration of the etching step is also determined based on the chemical composition of the substrate and is generally from about 10 seconds to about 4 minutes in length. For example, when using a KOH etchant, the etching time for a polyimide substrate is from about 20 seconds to about 3 minutes. Preferably the etching solution is maintained at a temperature of from about 40° C. to about 65° C. It has been found that neutralizing the surface with a dilute mineral acid to form a soluble salt and subsequently rinsing clean the surface with deionized water is desirable. Further, by altering the film residence time, the etch rate can be altered.

When etching is done by plasma etching, it may be performed in a plasma etching chamber as is well known in the art.

The next step is to apply a polymeric film onto one or both etched surfaces of the polymeric substrate. The polymeric film is preferably deposited onto the film as a liquid by coating, evaporation or vapor deposition to allow for control and uniformity of the polymer thickness. Preferred polymeric materials include polyimides, polyesters, polyester containing co-polymers, polyarylene ethers, liquid crystal polymers, polyphenylene ethers, amines, and combinations thereof.

Of these, polyimides are the most preferred. In another embodiment of the invention the polymeric film and the polymeric substrate comprise the same polymer.

Polyimides are preferred for the polymeric film because they have high electrical strengths, good insulating properties, a high softening point and are inert to many chemicals. Preferred are polyimides having a glass transition temperature (Tg) of from about 160° C. to about 320° C., with a glass transition temperature of from about 190° C. to about 270° C. are preferred. Preferably, the polymeric film will have a thickness of from about 2 $\mu$m to about 100 $\mu$m, more preferably from about 5 $\mu$m to about 50 $\mu$m.

The polymeric film may be applied to the polymeric substrate by coating a suitable solution onto the substrate and drying. The solution may be comprised of polymer precursors, a mixture of precursors and polymer or just polymer and an organic solvent. It is preferred that a single solvent be used in each solution. Useful solvents include acetone, methyl-ethyl ketone, N-methyl pyrrolidone, and mixtures thereof. The most preferred single solvent is N-methyl pyrrolidone. The polymer-solvent solution will typically have a viscosity ranging from about 5,000 to about 35,000 centipoise with a preferred viscosity in the range of 15,000 to 27,000 centipoise. The solution may comprise from about 10% by weight to about 60% by weight of polymer, more preferably from about 15% by weight to about 30% by weight of polymer with the remaining portion of the solution comprising one or more solvents. After application, the solvent is evaporated leaving a polymeric film on the substrate. Alternatively, a thin sheet of the polymer may be laminated under heat and pressure onto the substrate. In another embodiment, a molten mass of the polymer material may be extrusion coated onto the substrate.

The polymer film may also optionally incorporate a filler material. Preferred fillers non-exclusively include ceramics, boron nitride, silica, barium titanate, strontium titanate, barium strontium titanate, quartz, glass beads (microspheres), aluminum oxide, non-ceramic fillers and combinations thereof. If incorporated, a filler is preferably present in an amount of from about 5% to about 80% by weight of the film, more preferably from about 10% to about 50% by weight of the film.

Next, a metal foil is laminated to the substrate surface on which the polymer film has been formed. Lamination is preferably conducted by autoclave lamination, vacuum hydraulic pressing, non-vacuum hydraulic pressing or by hot roll lamination. Lamination may also be conducted using an ADARA™ press which comprises heating the metal foil by an amount sufficient to soften the polymeric film by flowing an electric current through the foil and attaching the polymeric film to the substrate. When using a vacuum press, lamination is preferably conducted at a minimum of about 275° C., for about 5–30 minutes. Preferably, the press is under a vacuum of at least 28 inches of mercury, and maintained at a pressure of about 150 psi.

Preferred metal foils for the printed circuit board support of the invention comprise copper, zinc, brass, chrome, nickel, aluminum, stainless steel, iron, gold, silver, titanium and combinations and alloys thereof. Most preferably, the metal foil comprises copper. Copper foils are preferably produced by electrodepositing copper from solution onto a rotating metal drum as is well known in the art. The metal foil preferably has a thickness of from about 3 $\mu$m to about 200 $\mu$m, more preferably from about 5 $\mu$m to about 50 $\mu$m. Alternatively, wrought copper foils may be used. However, the rolling process is effectively limited to producing foils no thinner than 18 microns.

The one or both sides of the metal foil may optionally be roughened, such as by micro-etching, by being electrolytically treated on the shiny side to form a roughened copper deposit, and or by being electrolytically treated on the matte side to include the deposition of micro-nodules of a metal or metal alloy on or in the surface. These nodules are preferably copper or a copper alloy, and increase adhesion to the polymer film. The surface microstructure of the foil may be measured by a profilometer, such as a Perthometer model M4P or S5P which is commercially available from Mahr Feinpruef Corporation of Cincinnati, Ohio. Topography measurements of the surface grain structure of peaks and valleys are made according to industry standard IPC-TM-650 Section 2.2.17 of the Institute for Interconnecting and Packaging Circuits of 2115 Sanders Road, Northbrook, Ill. 60062. The surface treatments are carried out to produce a surface structure having peaks and valleys which produce roughness parameters wherein the average roughness (Ra) ranges from about 1 to about 10 microns and the average peak to valley height (Rz) ranges from about 2 to about 10 microns.

The optional roughening of the shiny side of the foil is preferably carried out to produce a surface structure having peaks and valleys which produce with a roughness parameters wherein Ra ranges from about 1 to about 4 microns, preferably from about 2 to about 4 microns, and most preferably from about 3 to about 4 microns. The Rz value ranges from about 2 to about 4.5 microns, preferably from about 2.5 to about 4.5 microns, and more preferably from about 3 to about 4.5 microns.

The optional roughening of the matte side of the foil are preferably carried out to produce a surface structure having peaks and valleys which produce a roughness parameters wherein Ra ranges from about 4 to about 10 microns, preferably from about 4.5 to about 8 microns, and most preferably from about 5 to about 7.5 microns. The Rz value ranges from about 4 to about 10 microns, preferably from about 4 to about 9 microns, and more preferably from about 4 to about 7.5 microns.

An optional copper deposit on the shiny side of the foil will preferably produce a copper deposit of about 2 to about 4.5 $\mu$m thick to produce an average Ra value of 2 $\mu$m or greater. An optional nodule deposit on the matte side preferably will have an Ra value as made of about 4 to about 7.5 $\mu$m. The micro-nodules of metal or alloy will have a size of about 0.5 $\mu$m. Other metals may be deposited as micro nodules if desired, for example, zinc, indium, tin, cobalt, brass, bronze and the like. This process is more thoroughly described in U.S. Pat. No. 5,679,230.

In the preferred embodiment of the invention, the shiny surface preferably has a minimum peel strength of about 0.7 kg/linear cm., preferably from about 0.7 kg/linear cm, to about 1.6 kg/linear cm, more preferably from about 0.9 kg/linear cm to about 1.6 kg/linear cm. The matte surface preferably has a minimum peel strength of about 0.9 kg/linear cm and preferably from about 0.9 kg/linear cm to about 2 kg/linear cm, more preferably from about 1.1 kg/linear cm to about 2 kg/linear cm. Peel strength is measured according to industry standard IPC-TM-650 Section 2.4.8 Revision C.

In another embodiment of the invention, prior to lamination of the metal foil onto the polymeric film, a thin metal layer may optionally be electrolytically deposited onto either side of the metal foil. After lamination of the metal foil to the polymeric film, a thin metal layer may optionally be deposited onto the foil surface opposite the polymeric film by coating, sputtering, evaporation or by lamination onto the foil layer. Preferably the optional thin metal layer is a thin film and comprises a material selected such as nickel, tin, palladium platinum, chromium, titanium, molybdenum or alloys thereof. Most preferably the thin metal layer comprises nickel or tin. The thin metal layer preferably has a thickness of from about 0.01 $\mu$m to about 10 $\mu$m, more preferably from about 0.2 $\mu$m to about 3 $\mu$m.

The resulting laminate will have a peel strength that varies widely based on the thickness of the polymeric layers and the amount of substrate surface removal. For example, in order to obtain a laminate having an adequate peel strength of at least 4 lbs/inch, it is necessary to remove at least 0.45 $\mu$m from the substrate surface.

After the metal foil has been laminated onto the coated substrate, the next step is to selectively etch away portions of the metal foil or metal foil and optional thin metal layer, forming an etched pattern of circuit lines and spaces in the foil, or in the foil and optional thin metal layer. This etched pattern is formed by well known photolithographic techniques using a photoresist composition. First, a photoresist is deposited onto the metal foil or optional thin metal layer. The photoresist composition may be positive working or negative working and is generally commercially available. Suitable positive working photoresists are well known in the art and may comprise an O-quinone diazide radiation sensitizer. The O-quinone diazide sensitizers include the o-quinone-4-or-5-sulfonyl-diazides disclosed in U.S. Pat. Nos. 2,797,213; 3,106,465; 3,148.983; 3,130,047; 3,201,329; 3,785,825; and 3,802,885. When O-quinone diazides are used preferred binding resins include a water insoluble, aqueous alkaline soluble or swellable binding resin, which is preferably a novolak. Suitable positive photodielectric resins may be obtained commercially, for example, under the trade name of A7-P4620 from Clariant Corporation of Somerville, N.J. as well as Shipley I-line photoresist. Negative photoresists are also widely commercially available.

The photoresist is then imagewise exposed to actinic radiation such as light in the visible, ultraviolet or infrared regions of the spectrum through a mask, or scanned by an electron beam, ion or neutron beam or X-ray radiation. Actinic radiation may be in the form of incoherent light or coherent light, for example, light from a laser. The photoresist is then imagewise developed using a suitable solvent, such as an aqueous alkaline solution, thereby revealing underlying portions of the metal foil or optional thin metal layer.

Subsequently, the revealed underlying portions of the metal foil or metal foil and optional thin metal layer are removed through well known etching techniques, such as acid or alkaline etching, while not removing the portions underlying the remaining photoresist. Suitable etchants non-exclusively include acidic solutions, such as cupric chloride (preferable for etching of nickel) or nitric acid (preferable for etching of tin). Also preferred are ferric chloride or sulfuric peroxide (hydrogen peroxide with sulfuric acid). Suitable etchants also non-exclusively include alkaline solutions, such as ammonium chloride/ammonium hydroxide.

If the optional thin metal layer is included, this step will reveal the portions of the metal foil underlying the etched off portions of the thin metal layer. This patterned thin metal layer is then useful as a high quality etch mask for etching the metal foil. After the thin metal layer is etched, the next step is to remove the revealed underlying portions of the metal foil by etching while not removing the portions of the metal foil underlying the non-removed portions of the optional thin metal layer, revealing portions of the polymeric film underlying the etched metal foil.

If the optional thin metal layer is not included, the metal foil is directly etched to revealing the portions of the polymeric film underlying the etched off portions of the metal foil. The laminate may then be rinsed and dried. The result is a printed circuit board having excellent resolution and uniformity, good thermal resistance and excellent interlayer adhesion.

After the circuit lines and spaces are etched through the metal foil, the remaining photoresist can optionally be removed either by stripping with a suitable solvent or by ashing by well known ashing techniques. The photoresist may also be removed after etching the optional thin metal layer, but prior to etching the metal foil.

In another preferred embodiment of the invention, the above processes may be repeated on an opposite side of the substrate. In this embodiment, two opposite surfaces of the substrate are etched by the techniques described above, and a layer of a polymeric film material may be coated or laminated onto each etched surface, followed by lamination of a metal foil layer onto each polymeric film. Each metal foil layer may then be patterned and etched by the techniques described above, including by using an optional thin metal layer.

The following non-limiting examples serve to illustrate the invention:

EXAMPLE 1

A polyimide film substrate is plasma treated with a highly charged plasma etchant gas mixture of oxygen ($O_2$) and tetrafluroromethane ($CF_4$), the gas mixture containing 7% $CF_4$. The plasma etchant bombards the film surface with positively and negatively charged species causing impurities on the film surface to degrade and ablating the film surface. This etching step removes approximately 0.7 $\mu$m of material from the surface of the film. Subsequently, the etched surface is coated with a continuous layer of polyimide to achieve a layer thickness of 8 $\mu$m. The coated substrate and a copper foil layer are then laminated together in a vacuum press at about 275° C., for about 30 minutes, under a vacuum of at least 28 inches of mercury, and maintained at a pressure of about 150 psi. The resulting laminate has a peel strength of about 4 lbs/inch.

EXAMPLE 2

A polyimide substrate is plasma treated under similar conditions as in Example 1 using an etchant consisting of a gas mixture of oxygen ($O_2$) and tetrafluoro methane ($CF_4$), containing 7% $CF_4$. However, the etching step is conducted to remove approximately 0.475 $\mu$m of material from the surface of the film. After coating the etched surface with a polyimide film and laminating the coated substrate together with a copper foil as in Example 1, the resulting laminate exhibits a peel strength of about 4.5 lbs/inch.

EXAMPLE 3 (COMPARATIVE)

Example 1 is repeated except using an etchant having only 3% $CF_4$ and rather than limiting the etching step to remove approximately 0.7 $\mu$m of material from the surface of the film, the etching step is continued for about 15 minutes. This results in an overetched laminate having reduced peel strength. The peel strength of the laminate after fifteen minutes is only about 0.5 lbs/inch.

EXAMPLE 4

Example 1 is repeated, but rather than coating an etched substrate with only an 8 $\mu$m layer of polyimide, a 12 $\mu$m coating of polyimide is applied. This resulting laminate exhibits peel strength of about 7 lbs/inch.

EXAMPLE 5

Example 1 is repeated, but rather than coating an etched substrate with only an 8 $\mu$m layer of polyimide, a 30 $\mu$m coating of polyimide is applied. This resulting laminate exhibits peel strength of about 9 lbs/inch.

EXAMPLE 6

A 25 $\mu$m polyimide substrate is etched on both sides using similar etching conditions as in Example 1. Each etched surface is coated with a 12 $\mu$m layer of a polyimide, followed by lamination of a copper foil onto each polyimide layer on the opposite sides of the substrate under conditions similar to Example 1. The resulting laminate is a polyimide dielectric of about 50 $\mu$m, having a peel strength in excess of 7 lbs/inch.

EXAMPLE 7

A 25 $\mu$m polyimide substrate is chemically etched by running the film through solution of 12% by weight NaOH in water at 47° C. followed by a 5% sulfuric acid neutralization and a final deionized water rinse. The substrate is subsequently coated with 5 $\mu$m of polyimide. A 9 $\mu$m copper foil is then laminated to the coated substrate under conditions similar to Example 1. The resulting laminate has a peel strength of 6 lbs/inch.

EXAMPLE 8 (COMPARATIVE)

An unetched 25 $\mu$m polyimide substrate is coated with 5 $\mu$m of polyimide. A 9 $\mu$m copper foil laminated to the coated substrate under conditions similar to Example 1. The result is a laminate having a peel strength of only about 0.5 lbs/inch.

While the present invention has been particularly shown and described with reference to preferred embodiments, it will be readily appreciated by those of ordinary skill in the art that various changes and modifications may be made without departing from the spirit and scope of the invention. It is intended that the claims be interpreted to cover the disclosed embodiment, those alternatives which have been discussed above and all equivalents thereto.

What is claimed is:

1. A process for forming a printed circuit hoard composite comprising:
 a) etching at least one of two opposite surfaces of a planar polymeric substrate;
 b) laminating a polymeric film onto one or both etched surfaces of the polymeric substrate, which polymeric film comprises a material selected from the group consisting of polyimides, polyesters, polyester containing co-polymers, polyarylene ethers, liquid crystal polymers, polyphenylene ethers, amines, and combinations thereof; and
 c) laminating and attaching a metal foil onto the polymeric film.

2. The process of claim 1 comprising laminating the polymeric film onto one etched surface of the substrate.

3. The process of claim 1 wherein a polymeric film is attached onto one etched surface of the substrate by coating.

4. The process of claim 1 wherein both opposite surfaces of the substrate are etched.

5. The process of claim 1 comprising laminating a polymeric film onto both opposite etched surfaces of the substrate and laminating and attaching a metal foil onto both polymeric films.

6. The process of claim 1 comprising laminating the polymeric film onto one etched surface of the substrate, attaching another polymeric film onto an opposite etched surface of the substrate by coating, and attaching a metal foil onto both polymeric films.

7. The process of claim 1 wherein the polymeric film and the polymeric substrate comprise the same polymer.

8. The process of claim 1 wherein the substrate comprises a polyester.

9. The process of claim 1 wherein the substrate comprises a polyimide.

10. The process of claim 1 wherein the polymeric film comprises a polyester.

11. The process of claim 1 wherein the polymeric film comprises a polyimide.

12. The process of claim 1 wherein the metal foil comprises a material selected from the group consisting of copper, zinc, brass, chrome, nickel, aluminum, stainless steel, iron, gold, silver, titanium and combinations and alloys thereof.

13. The process of claim 1 wherein the metal foil comprises copper.

14. The process of claim 1 wherein the polymeric film has a thickness of about 3 μm to about 50 μm.

15. The process of claim 1 wherein the metal foil has a thickness of about 3 μm to about 200 μm.

16. The process of claim 1 wherein etching step (a) is conducted with an aqueous alkaline solution.

17. The process of claim 1 wherein etching step (a) is conducted with an aqueous solution comprising a Group I or Group II hydroxide.

18. The process of claim 1 wherein etching step (a) is conducted with an aqueous alkaline solution comprising NaOH or KOH.

19. The process of claim 1 wherein etching step (a) is conducted with a plasma etchant.

20. The process of claim 1 wherein etching step (a) is conducted with a plasma etchant comprising a mixture of oxygen ($O_2$) and tetrafluoromethane.

21. The process of claim 20 wherein the plasma etchant comprises at least about 3% of tetrafluoromethane.

22. The process of claim 20 wherein the plasma etchant comprises greater than about 7% of tetrafluoromethane.

23. The process of claim 1 wherein etching step (a) is conducted such that at least about 0.45 μm of the substrate surface is removed.

24. The process of claim 1 wherein laminating is conducted by autoclave lamination; vacuum hydraulic pressing; non-vacuum hydraulic pressing; hot roll lamination; or by heating the metal foil by an amount sufficient to soften the polymeric film by flowing an electric current through the foil and attaching the polymeric film to the substrate.

25. A process for forming a printed circuit board comprising:

a) etching at least one of two opposite surfaces of a planar polymeric substrate;

b) laminating a polymeric film onto one or both etched surfaces of the polymeric substrate, which polymeric film corn rises a material selected from the group consisting of polyimides, polyesters, polyester containing co-polymers, polyarylene ethers, liquid crystal polymers, polyphenylene ethers, amines, and combinations thereof;

c) laminating and attaching a metal foil onto the polymeric film;

d) depositing a photoresist onto the metal foil;

e) exposing and developing the photoresist, thereby revealing underlying portions of the metal foil; and f) removing the revealed underlying portions of the metal foil.

26. The process of claim 25 further comprising roughening the surface of the metal foil opposite the polymeric film prior to step (d).

27. The process of claim 26 wherein the roughened surface of the metal foil has an average roughness value that ranges from about 1 to about 10 microns.

28. The process of claim 26 wherein the roughened surface of the metal foil comprises micro-nodules of a metal or metal alloy on or in the roughened surface.

29. The process of claim 26 wherein the roughened surface of the metal foil is roughened by micro-etching.

30. The process of claim 25 further comprising the step of removing any remaining photoresist after step (f).

31. The process of claim 25 wherein the revealed portions of the metal foil are removed by acid etching.

32. The process of claim 25 wherein the revealed portions of the metal foil are removed by alkaline etching to the substrate.

* * * * *